United States Patent
Mikami et al.

[19]

[11] Patent Number: 6,124,003
[45] Date of Patent: Sep. 26, 2000

[54] FILM DEPOSITING METHOD AND FILM DEPOSITING APPARATUS

[75] Inventors: Takashi Mikami; Hiroshi Murakami, both of Kyoto, Japan

[73] Assignee: Nissin Electric Co., Ltd., Kyoto, Japan

[21] Appl. No.: 09/283,289

[22] Filed: Apr. 1, 1999

[30] Foreign Application Priority Data

Apr. 2, 1998 [JP] Japan .................................. 10-090224

[51] Int. Cl.$^7$ ............................. H05H 1/46; H01S 27/02; G21K 1/087
[52] U.S. Cl. ........................ 427/562; 427/569; 427/570; 118/723 FI
[58] Field of Search ................................... 427/523, 524, 427/526, 562, 563, 564, 569, 570, 575; 118/723 FI

[56] References Cited

U.S. PATENT DOCUMENTS

| | | | |
|---|---|---|---|
| 3,734,769 | 5/1973 | Hirschfeld ............................... | 427/523 |
| 4,440,108 | 4/1984 | Little et al. ........................ | 118/723 FI |
| 4,876,983 | 10/1989 | Fukuda et al. ..................... | 118/723 MR |
| 4,986,214 | 1/1991 | Zumoto et al. ..................... | 118/723 MR |
| 4,987,346 | 1/1991 | Katzschner et al. ............... | 118/723 FI |
| 5,110,435 | 5/1992 | Haberland ............................ | 427/562 |
| 5,133,825 | 7/1992 | Hakamata et al. ................. | 118/723 MR |
| 5,284,544 | 2/1994 | Mizutani et al. .................... | 118/723 FI |
| 5,518,572 | 5/1996 | Kinoshita et al. ................. | 118/723 MR |
| 6,051,120 | 4/2000 | Kishida et al. ...................... | 118/723 FI |

FOREIGN PATENT DOCUMENTS

| | | | |
|---|---|---|---|
| 6-3279552 | 11/1988 | Japan ................................. | 118/723 FI |
| 405211120A | 8/1993 | Japan ................................. | 118/723 FI |
| 7-65781 | 3/1995 | Japan . | |
| 9-208389 | 8/1997 | Japan . | |

*Primary Examiner*—Marianne Padgett
*Attorney, Agent, or Firm*—Arent Fox Kintner Plotkin & Kahn PLLC

[57] ABSTRACT

A film is deposited on a target object by exposing the target object to film deposition plasma of a film deposition material gas while irradiating the target object with ion beams. An ion source is used for the irradiation with the ion beams. The ion source has a plasma container and an ion beam producing electrode system formed of four electrodes. The plasma container and the first electrode located in an inner position nearest to the plasma container carry a positive potential. The second electrode carries a negative potential or a lower potential than the film deposition plasma. The third electrode carries a positive potential or a higher potential than the film deposition plasma. The fourth electrode in the outer position remotest from the plasma container carries a ground potential.

3 Claims, 2 Drawing Sheets

Fig.2 (PriorArt)
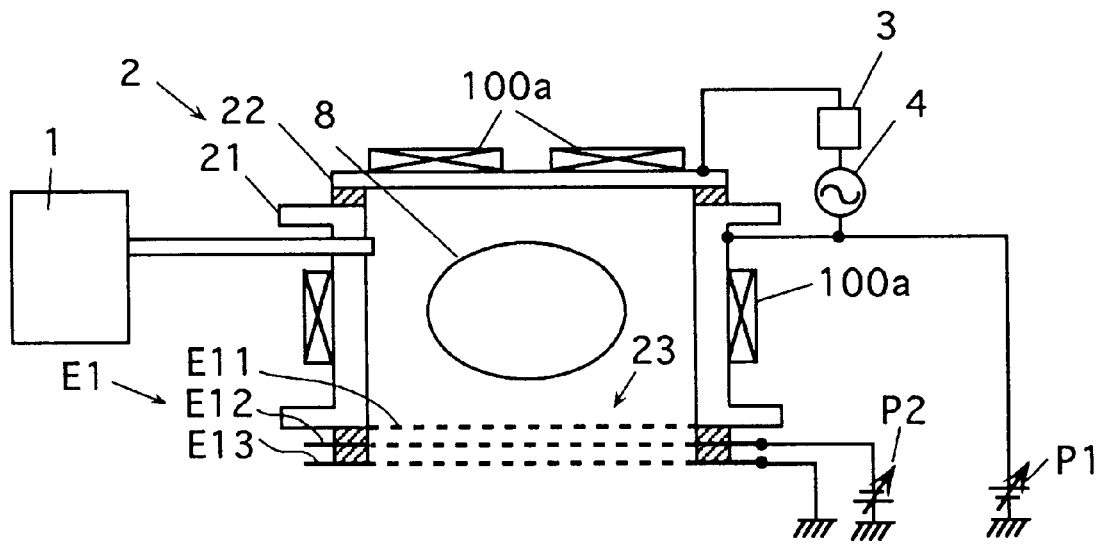
Fig.3 (PriorArt)
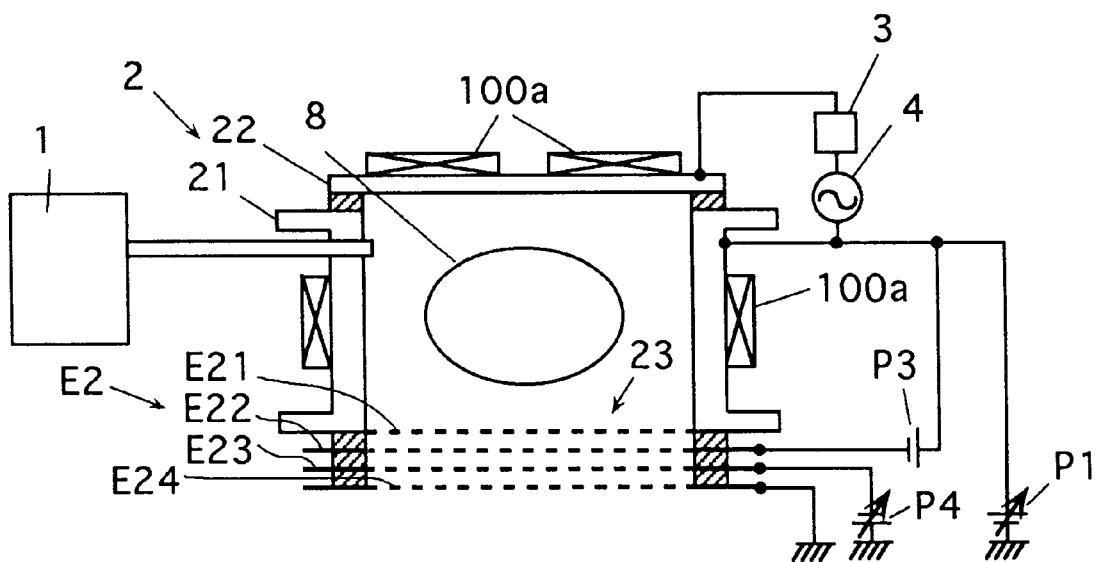

FILM DEPOSITING METHOD AND FILM DEPOSITING APPARATUS

The invention is based on patent application No. 10-90224 Pat. filed in Japan, the contents of which are hereby incorporated by reference.

BACKGROUND OF THE INVENTION

1. Field of the Invention

The present invention relates to a method and an apparatus for depositing a film on an object or a good by exposing the object to plasma of a deposition material gas while irradiating the same with ion beams.

2. Description of the Background Art

In a plasma CVD method, an electric power is supplied to a deposition material gas to form plasma from the gas, and a film is deposited on a target object (i.e., an object on which a film is to be deposited) in the plasma. In this method, it has been attempted to perform irradiation with ion beams in addition to the film deposition with the plasma.

For example, Japanese Laid-Open Patent Publication No. 9-208389 has disclosed a method for depositing a film, in which a target object is exposed to plasma formed from a deposition material gas, and the surface of the object is irradiated with ion beams.

For producing the ion beams, an ion beam producing electrode system which is formed of two electrodes has been employed. Alternatively, the electrode system formed of three electrodes may be employed. According to the electrode system formed of three electrodes, the ion beams can be monitored more accurately than the electrode system formed of two electrodes (in the case where the outer electrode is at a ground potential). Further, the former can produce more ion beams and can control more precisely an ion beam divergence angle, compared with the latter.

FIG. 2 shows by way of example an ion source having a beam producing electrode system formed of three electrodes in the prior art. The ion source in FIG. 2 has a cylindrical plasma container 2, which is formed of a radio-frequency (RF) electrode 21 forming a cylindrical sidewall and an RF electrode 22 forming an upper wall. The RF electrodes 21 and 22 are electrically isolated from each other, and an RF power source 4 is connected between the electrodes 21 and 22 with a matching unit 3. A positive power source P1 which can apply a positive voltage to the electrodes 21 and 22 is also connected thereto. A gas supply unit 1 of an ion material gas is connected to the plasma container 2. The gas supply unit 1 includes a mass-flow controller, a valve and a gas source, which are not shown in the figures. In a structure, e.g., including the ion source which is arranged continuously to the film depositing device, the gas introduced into the device and diffusing into the ion source may be used as the ion material gas. In this case, the gas supply unit 1 may be eliminated.

An ion beam producing electrode system E1 formed of three electrodes is arranged in an ion beam producing port 23 of the plasma container 2. The electrode system E1 is formed of first, second and third electrodes E11, E12 and E13, which are arranged in this order from the container 2 side toward the outer side. Each of the electrodes is porous or is provided with slits. The first electrode E11 is electrically continuous to the plasma container 2 which is in turn connected to the positive power source P1. The second electrode E12 is connected to a negative power source P2 for applying a negative voltage thereto. The third electrode E13 carries a ground potential. These electrodes E11, E12 and E13 are electrically isolated from each other. A magnet 100a which provides a magnetic field is arranged outside the plasma container 2 for stably maintaining the plasma.

Positive ion beams are produced from the ion source, for example, in the following manner. An exhaust device, which is employed for the film depositing device provided with the ion source, is operated to reduce the pressure in the plasma container 2 to a predetermined value. Then, the material gas supply unit 1 supplies the material gas of the ion beam into the container 2, and the radio-frequency power source 4 applies a radio-frequency power across the electrodes 21 and 22 via the matching unit 3 so that the plasma is produced from the supplied gas (in the position within the plasma container 2 indicated by "8" in the figure). The electrodes 21 and 22 are also supplied with the positive voltage from the positive power source P1, and thus carry the positive potential so that the first electrode E11 carries the same (i.e., positive) potential as the plasma container 2. The second electrode E12 supplied with the negative voltage from the negative power source P2 carries the negative potential. Thereby, the potential difference between the first and second electrodes E11 and E12 produces the positive ion beams from the plasma 8 formed in the plasma container 2. The third electrode E13 fixes the energy of the ion beams with respect to the ground potential. One of the reasons for which the second electrode E12 is kept at the negative potential is to prevent reverse flow of electrons into the container 2, i.e., ion source, e.g., from the space within the chamber continuous to the ion source and from the chamber wall. The flow of electrons into the plasma 8 in the container 2 is equivalent to the outflow of ions from the plasma 8. Therefore, flow of electrons into the ion source prevents accurate monitoring of the quantity of the produced ion beams.

However, if the first electrode carries a high potential in the ion source having the beam producing electrode system formed of three electrodes shown in FIG. 2, the second electrode is spaced from the first electrode by a long distance for preventing insulation breakage. In this case, if the potential on the first electrode is variable over a wide range, the power source for applying the voltage to the second electrode must have a very wide variable range in order to maintain the substantially constant intensity of the electric field between the first and second electrodes. This increases the size and cost of the power source.

In order to avoid the above, the device may employ an ion source having an ion beam producing electrode system which is formed of four electrodes, e.g., as shown in FIG. 3. This ion source employs an ion beam producing electrode system E2 instead of the ion beam producing electrode system E1 employed in the ion source shown in FIG. 2. The beam producing electrode system E2 is formed of first, second, third and fourth electrodes E21, E22, E23 and E24 arranged in this order from the side nearest to the plasma container to the outer side. The first electrode E21 is electrically continuous to the plasma container 2 connected to the positive power source P1. The second electrode E22 is connected in series to the positive power source P1 and a power source P3, which can apply a negative voltage, so that the negative power source P3 can keep a constant potential difference between the electrodes E21 and E22 even if the output voltage of the positive power source P1 is variable. The third electrode E23 is connected to a negative power source P4 for applying a negative voltage. The fourth electrode E24 carries the ground potential. The electrodes E21, E22, E23 and E24 are electrically insulated from each other. Structures other than the above are similar to those of the device shown in FIG. 2, and the substantially same parts and members bear the same reference numbers.

For producing the ion beams from the ion source shown in FIG. 3, the plasma 8 is formed from the ion material gas in a manner similar to that of the device shown in FIG. 2, and the ion beams are produced from the plasma by the potential difference between the first and second electrodes E21 and E22, and are accelerated by the potential difference between the second and third electrodes E22 and E23. The fourth electrode E24 fixes the energy of the ion beams with respect to the ground potential.

The purpose of keeping the third electrode E23 at the negative potential is to suppress reverse flow of the electrons into the ion source from the position irradiated with the ion beams emitted from the ion source. In this device, since the negative power source P3 keeps the constant potential difference between the first and second electrodes E21 and E22, the power source P3 is required only to apply a relatively small voltage. For example, the positive power source P1 applies a voltage of 10 kV to the first electrode E21, and the negative power source P3 applies a voltage of −500 V to the second electrode E22 so that the potential difference of 500 V is kept between the second and first electrodes E22 and E21, and the positive voltage of 9.5 kV is applied to the second electrode E22. As described above, the electric field intensity for producing the ion beams can be kept constant without increasing the size of the power source P3.

However, the conventional ion sources having the electrode systems which are formed of three or four electrodes suffer from the following problems if the irradiation with ion beams is performed simultaneously with the deposition of the film by the plasma on the target object which is placed in the film depositing device.

In the foregoing ion source having the electrode system which is formed of three or fourth electrodes, and is arranged in the position opposed to the region occupied by the high-density plasma for film deposition, abnormal discharge may occur between the electrodes in the beam producing electrode system. Further, short-circuit disabling the operation may occur. The reason for this can be considered as follows. Positive ions derived from the plasma for film deposition, which have moved into the beam producing electrode system, are located between the first electrode carrying the positive potential and the second electrode carrying the negative potential in the three-electrode system, and is located between the second electrode normally carrying the positive potential and the third electrode carrying the negative potential in the four-electrode system. Particularly, many positive ions are present near the second electrode in the three-electrode system, and are located near the third electrode in the four-electrode system. Therefore, it is difficult to produce the positive ion beams from the ion source due to such positive space charges, and the positive charges filling the space between the electrodes cause the abnormal discharges and others.

In order to avoid the above, the ion source may be arranged in a position remote from the region where the high-density plasma for film deposition is produced, i.e., in a position remote from the region near the electrode supplied with the power for plasma excitation. In this case, however, the ion beams which can arrive at the target object decrease in quantity, and the device increases in size. Such a structure may also be employed that the region, where the high-density plasma for film deposition is produced, and therefore the electrode supplied with the electric power for plasma excitation, as well as the region near the same are shielded against the beam producing electrode system of the ion source in order to avoid direct contact between the beam producing electrode system and the high-density plasma for film deposition. However, this results in complication of the device structure and increase in device size.

SUMMARY OF THE INVENTION

Accordingly, an object of the invention is to provide a film depositing method for depositing a film, and particularly a method which performs film deposition with plasma as well as irradiation with ion beams, and can perform the ion beam irradiation without a difficulty while suppressing problems such as occurrence of abnormal discharge in the ion beam producing electrode system.

Another object of the invention is to provide a film depositing apparatus provided with an ion source, and particularly a film depositing apparatus, which can accurately operate without causing problems such as abnormal discharge in the ion beam producing electrode system in the ion source, and can have a simple and small structure.

The invention provides following apparatus and method for film deposition belonging to a first type.

Apparatus and Method for Film Deposition of the First Type (1-1) Film Depositing Method A method of depositing a film on a target object by exposing the target object to film deposition plasma obtained by supplying an electric power for plasma excitation to a film deposition material gas while irradiating the target object with ion beams, wherein an ion source is used for the irradiation with the ion beams, the ion source produces the ion beams from plasma produced from an ion material gas in a plasma container by applying a voltage to an ion beam producing electrode system formed of four electrodes arranged in an ion beam producing port of the plasma container, and potentials are placed on the plasma container and the four electrodes forming the ion beam producing electrode system during producing of the ion beams such that the plasma container and the first electrode among the four electrodes located in an inner position nearest to the plasma container carry a positive potential, the second electrode immediately outside the first electrode carries a negative potential, the third electrode immediately outside the second electrode carries a positive potential and the fourth electrode in the outer position remotest from the plasma container carries a ground potential.

(1-2) Film Depositing Apparatus

A film depositing apparatus for depositing a film on a target object, comprising:

a film deposition plasma producing chamber;

a material gas supply device for suppling a film deposition material gas into the film deposition plasma producing chamber;

a plasma excitation electric power supply device for suppling an electric power to the film deposition material gas in the chamber for forming film deposition plasma from the material gas;

a support device for supporting the target object in the film deposition plasma producing chamber; and an ion souce for irradiating the target object sopported by the support device with ion beams;

the ion source including a plasma container and being operable to produce the ion beams from plasma produced from an ion material gas in the plasma container by applying a voltage to an ion beam producing electrode system formed of first, second, third and fourth electrodes and arranged in an ion beam producing port of said plasma container;

the plasma container being connected to a power source device for placing a positive potential on the container;

the first electrode nearest to said plasma container being connected to a power source device for placing a positive potential on the first electrode;

the second electrode immediately outside the first electrode being connected to a power source device for placing a negative potential on the second electrode;

the third electrode immediately outside the second electrode being connected to a power source device for placing a positive potential on the third electrode; and the fourth electrode located in the outer position remotest from the plasma container being electrically grounded.

The invention also provides following apparatus and method for film deposition belonging to a second type.

Apparatus and Method for Film Deposition of the Second Type (2-1) Film Depositing Method A method of depositing a film on a target object by exposing the target object to film deposition plasma obtained by supplying an electric power for plasma excitation to a film deposition material gas while irradiating the target object with ion beams, wherein an ion source is used for the irradiation with the ion beams, the ion source produces the ion beams from plasma produced from an ion material gas in a plasma container by applying a voltage to an ion beam producing electrode system formed of four electrodes arranged in an ion beam producing port of the plasma container, and potentials are placed on the plasma container and the four electrodes forming the ion beam producing electrode system during producing of the ion beams such that the plasma container and the first electrode among the four electrodes located in an inner position nearest to the plasma container carry a positive potential, the second electrode immediately outside the first electrode carries a lower potential than the film deposition plasma, the third electrode immediately outside the second electrode carries a higher potential than the film deposition plasma and the fourth electrode in the outer position remotest from the plasma container carries a ground potential.

(2-2) Film Depositing Apparatus

A film depositing apparatus for depositing a film on a target object, comprising:

a film deposition plasma producing chamber;

a material gas supply device for suppling a film deposition material gas into the film deposition plasma producing chamber;

a plasma excitation electric power supply device for suppling an electric power to the film deposition material gas in the chamber for forming film deposition plasma from the material gas;

a support device for supporting the target object in the film deposition plasma producing chamber; and an ion souce for irradiating the target object sopported by the support device with ion beams;

the ion source including a plasma container and being operable to produce the ion beams from plasma produced from an ion material gas in the plasma container by applying a voltage to an ion beam producing electrode system formed of first, second, third and fourth electrodes and arranged in an ion beam producing port of said plasma container;

the plasma container being connected to a power source device for placing a positive potential on the container;

the first electrode nearest to the plasma container being connected to a power source device for placing a positive potential on the first electrode;

the second electrode immediately outside said first electrode being connected to a power source device for placing a lower potential than the film deposition plasma on the second electrode;

the third electrode immediately outside the second electrode being connected to a power source device for placing a higher potential than the film deposition plasma on the third electrode; and the fourth electrode located in the outer position remotest from the plasma container being electrically grounded.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows by way of example a schematic structure of an ion source having an ion beam producing electrode system formed of three electrodes in the prior art; and FIG. 3 shows by way of example a schematic structure of an ion source having an ion beam producing electrode system formed of four electrodes in the prior art.

DESCRIPTION OF THE PREFERRED EMBODIMENTS

Figure 1A:
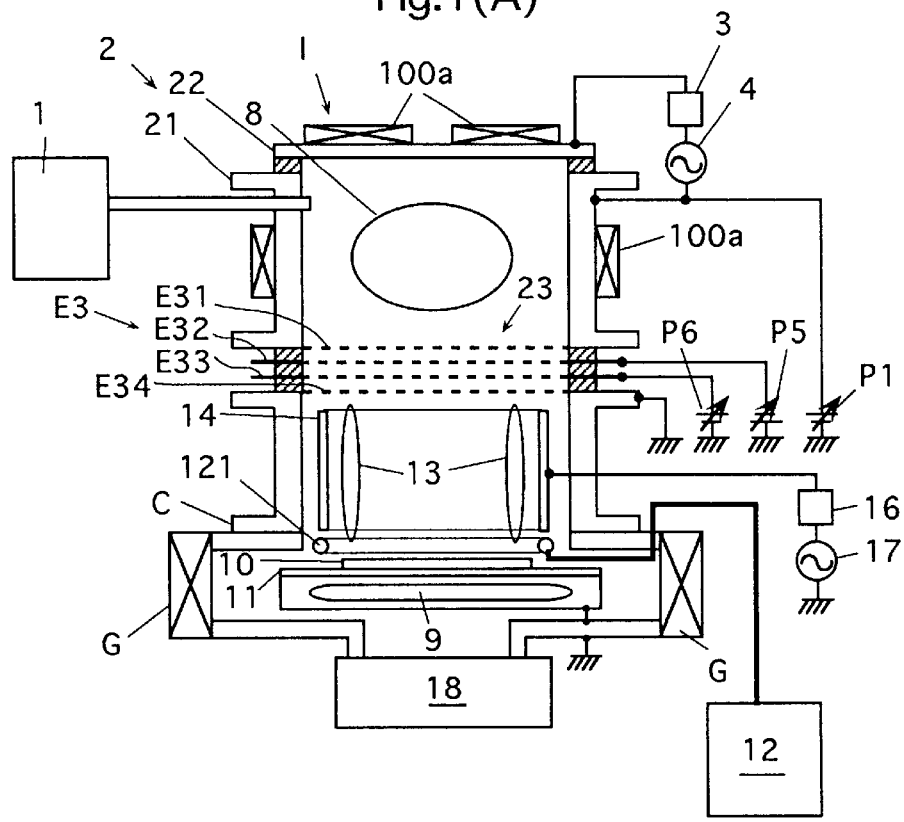
FIGS. 1(A) and 1(B) show by way of example schematic structures of film depositing apparatuses according to the invention.

According to an embodiment of the invention, a method and an apparatus for film deposition may be as follows.

In the film depositing method of the embodiment of the invention, a film is deposited on a target object by exposing the target object to film deposition plasma obtained by supplying an electric power for plasma excitation to a film deposition material gas while irradiating the target object with ion beams.

An ion source is used for the irradiation with the ion beams. The ion source produces the ion beams from plasma produced from an ion material gas in a plasma container by applying a voltage to an ion beam producing electrode system formed of four electrodes arranged in an ion beam producing port of the plasma container.

Potentials are placed on the plasma container and the four electrodes forming the ion beam producing electrode system during producing of the ion beams such that the plasma container and the first electrode among the four electrodes located in an inner position nearest to the plasma container carry a positive potential, the second electrode immediately outside the first electrode carries a negative potential, the third electrode immediately outside the second electrode carries a positive potential and the fourth electrode in the outer position remotest from the plasma container carries a ground potential.

In the film depositing device of the embodiment of the invention, a film is deposited on a target object in such a manner that a material gas supply device supplies a film deposition material gas into a film deposition plasma producing chamber, a plasma excitation electric power supply device supplies an electric power for forming film deposition plasma from the material gas, and the target object supported by a support device is exposed to the film deposition plasma while being irradiated with ion beams emitted from an ion source.

The ion source is operable to produce the ion beams from plasma produced from an ion material gas in a plasma container by applying a voltage to an ion beam producing electrode system formed of first, second, third and fourth electrodes and arranged in an ion beam producing port of the plasma container.

The plasma container is connected to a power source device for placing a positive potential on the container, the first electrode nearest to the plasma container is connected to a power source device for placing a positive potential on the first electrode, the second electrode immediately outside the first electrode is connected to a power source device for placing a negative potential on the second electrode, the third electrode immediately outside the second electrode is connected to a power source device for placing a positive potential on the third electrode, and a ground potential is placed on the fourth electrode located in the outer position remotest from the plasma container.

For performing the irradiation with the ion beams emitted from the ion source in the above method and apparatus for the film deposition, positive ion beams are produced from the plasma, which is produced in the plasma container of the ion source, based on the potential difference between the first electrode carrying the positive potential and the second electrode carrying the negative potential. The fourth electrode fixes the energy of the ion beams with respect to the ground potential. The positive potential on the third electrode is not increased to such an extent that impedes passage of the produced positive ion beams.

In the case where the ion beam producing electrode system in the ion source is arranged in contact with the high-density plasma for film deposition, the film deposition plasma, i.e., the plasma for film deposition passes through the outermost fourth electrode carrying the ground potential, and the inner third electrode carrying the positive potential suppresses flow of positive ions in the plasma into the ion source. The second electrode carrying the negative potential suppresses flow of electrons in the plasma, which passed through the third electrode, into the ion source. Even if the film deposition plasma flows into a space between the fourth and third electrodes, abnormal discharge and short-circuit do not occur between the fourth and third electrodes because the third electrode is at a relatively low positive potential. Even if they occurred, the extent thereof would be ignorably small. Owing to the above, normal operation can be performed. Since flow of the positive ions and electrons from the plasma into the ion source is suppressed, the quantity of the produced ion beams from the ion souce can be accurately monitored.

Owing to the above, the film depositing apparatus can have such a structure that the ion beam producing electrode system of the ion source is opposed to the region where the film deposition plasma is formed. This arrangement can reduce the size of the device, and can prevent complication of the structure.

According to another embodiment of the invention, a method and an apparatus for film deposition may be as follows.

In the film depositing method of another embodiment of the invention, a film is deposited on a target object by exposing the target object to film deposition plasma obtained by supplying an electric power for plasma excitation to a film deposition material gas while irradiating the target object with ion beams.

An ion source is used for the irradiation with the ion beams. The ion source produces the ion beams from plasma produced from an ion material gas in a plasma container by applying a voltage to an ion beam producing electrode system formed of four electrodes arranged in an ion beam producing port of the plasma container.

Potentials are placed on the plasma container and the four electrodes forming the ion beam producing electrode system during producing of the ion beams such that the plasma container and the first electrode among the four electrodes located in an inner position nearest to the plasma container carry a positive potential, the second electrode immediately outside the first electrode carries a lower potential than the film deposition plasma, the third electrode immediately outside the second electrode carries a higher potential than the film deposition plasma and the fourth electrode in the outer position remotest from the plasma container carries a ground potential.

In the film depositing apparatus of another embodiment of the invention, a film is deposited on a target object in such a manner that a material gas supply device supplies a film deposition material gas into a film deposition plasma producing chamber, a plasma excitation electric power supply device supplies an electric power for forming film deposition plasma from the material gas, and the target object supported by a support device is exposed to the film deposition plasma while being irradiated with ion beams emitted from an ion source.

The ion source is operable to produce the ion beams from plasma produced from an ion material gas in a plasma container by applying a voltage to an ion beam producing electrode system formed of first, second, third and fourth electrodes and arranged in an ion beam producing port of the container.

The plasma container is connected to a power source device for placing a positive potential on the container, the first electrode nearest to the plasma container is connected to a power source device for placing the positive potential on the first electrode, the second electrode immediately outside the first electrode is connected to a power source device for placing a lower potential than the film deposition plasma on the second electrode, the third electrode immediately outside the second electrode is connected to a power source device for placing a higher potential than the film deposition plasma on the third electrode, and a ground potential is placed on the fourth electrode located in the outer position remotest from the plasma container.

For performing the irradiation with the ion beams emitted from the ion source in the above method and apparatus for the film deposition, positive ion beams are produced from the plasma, which is produced in the plasma container, based on the potential difference between the first electrode carrying the positive potential and the second electrode carrying the lower potential than the film deposition plasma. A higher potential than the second electrode is placed on the first electrode. The fourth electrode fixes the energy of the ion beams with respect to the ground potential. The potential on the third electrode may be, e.g., at most, slightly higher than the film deposition plasma. The potential on the third electrode is set to such an extent that the third electrode does not impede passage of the produced positive ion beams.

In the case where the ion beam producing electrode system in the ion source is arranged in contact with the high-density plasma for film deposition, the film deposition plasma passes through the outermost fourth electrode carrying the ground potential, and the inner third electrode carrying the higher potential than the film deposition plasma suppresses flow of positive ions in the plasma into the ion source. The second electrode carrying the lower potential than the film deposition plasma suppresses flow of electrons in the plasma, which passed through the third electrode, into the ion source. Even if the film deposition plasma flows into a space between the fourth and third electrodes, problems such as abnormal discharge and short-circuit between the fourth and third electrodes can be suppressed because the potential on the third electrode can be, at most, slightly higher than that of the film deposition plasma. Therefore, the normal operation can be performed. Since flow of the positive ions and electrons from the plasma into the ion source is suppressed, the quantity of the produced ion beams can be accurately monitored.

Owing to the above, the film depositing apparatus can have such a structure that the ion beam producing electrode system of the ion source is opposed to the region where the plasma is formed from the film deposition material gas. This arrangement can reduce the size of the device, and can prevent complication of the structure.

In either of the foregoing film depositing methods, the plasma container of the ion source and the first electrode of the ion beam producing electrode system are normally at the same potential. In this case, the plasma container and the first electrode in each film depositing apparatus may be connected to the different power source devices, which set the plasma container and the first electrode to the same potential, respectively. Alternatively, the first electrode may be electrically continuous to the plasma container via a direction connection or a resistor, and one of them (e.g., the plasma container) may be connected to a power source device common to the both.

In either of the foregoing film depositing apparatuses, the plasma excitation electric power supply device may include, as an electrode for supplying the plasma excitation power, an electrode having an opening and opposed to a periphery of the target object supported by the support device, and the ion source can emit the ion beams to the target object through the opening in the electrode.

The electrode opposed to the periphery of the target object may be the electrode in its literal sense, i.e., the electrode which is opposed to the periphery of the target object, and may also be an electrode which is arranged in a position opposed to or near the periphery of the target object, a position related to the periphery or the like so as to form the plasma near the periphery of the target object. More specifically, the electrode may be a ring-like electrode, a cylindrical electrode, a coil-like electrode, an electrode of a Lisitano coil type, an antenna for introducing microwaves or the like which is opposed to the periphery of the target object.

In the case where the ring-like electrode, cylindrical electrode or coil-like electrode is used, the power source included in the plasma excitation power supply device is typically an RF (radio-frequency) or high frequency power source. In the case where the electrode of the Lisitano coil type is used, a microwave power source is usually used as the power source and a magnetic field forming device is arranged for the outer peripheral portion of the Lisitano coil so as to produce electron cyclotron resonance (ECR) plasma. In the case where the ring-shaped electrode, cylindrical electrode, coil-shaped electrode or microwave introduction antenna is used, a magnetic field producing device may be arranged for the outer peripheral portion of the electrode or antenna. By forming the magnetic field, the plasma can be formed and maintained easily even at a low pressure (i.e., in a high vacuum).

By employing the electrode opposed to the peripheral portion of the target object supported by the support device, the plasma can be formed near the outer peripheral portion of the object, and direct emission of fast ions (i.e., ions having a high energy) and fast electrons from the plasma to the target object is suppressed so that the film of a high quality with less defects can be grown without excessively damaging the film glowing surface. In addition to the above, the target object is irradiated with the ion beams from the ion source., and the ion species, ion accelerating energy and others of the ion beams can be appropriately selected or controlled. This achieves effects such as surface excitation, improvement in crystallinity and control of crystalline orientation in the case where a crystalline film is to be formed in accordance with the kind of the material gas. Therefore, migration of film constituent atoms is promoted, and the film formed on the target object can have good crystallinity.

Embodiments of the invention will now be described with reference to the drawings.

FIG. 1(A) shows a schematic structure of an example of the film depositing apparatus. This apparatus has a plasma forming chamber C, which is connected to a vacuum exhaust unit 18 and a material gas supply unit 12. The material gas supply unit 12 includes a ring-shaped gas injection pipe 121, a mass-flow controller, a valve and a gas source, but only the gas injection pipe 121 is shown in the figure. A target object holder member 11 is arranged in the chamber C. The holder member 11 can be horizontally reciprocated by a drive unit (not shown) for transporting a deposition target object 10 into and from the chamber C. The holder member 11 in the chamber C is located on a heater 9 for heating the object 10. A cylindrical electrode 14 is arranged in a position opposed to the peripheral portion of the object 10 held by the holder member 11. The electrode 14 is connected to an RF power source (high frequency power source) 17 through a matching unit 16.

An ion source I is arranged in a position which is opposed to the holder member 11 with the cylindrical electrode 14 therebetween. The ion source I is provided with a beam producing electrode system E3 instead of the electrode system E1 employed in the ion source shown in FIG. 2. The beam producing electrode system E3 is formed of first, second, third and fourth electrodes E31, E32, E33 and E34, which are arranged in this order from the side near the plasma container 2 toward the plasma forming chamber C. The first electrode E31 is connected directly (or via an electric resistor) to the plasma container 2 connected to a positive power source P1. The second electrode E32 is connected to a negative power source P5. The third electrode E33 is connected to a positive electrode P6. The fourth electrode E34 is grounded. The first, second, third and fourth electrodes E31, E32, E33 and E34 are electrically isolated from each other. In FIG. 1(A), "G" indicates a gate valve for transporting the object into and from the chamber. Structures of the ion source I other than the above are the same as those of the ion source shown in FIG. 2, and the substantially same parts bear the same reference numbers. In this structure, the first electrode E31 is electrically continuous to the plasma container 2. Alternatively, an independent power source may be connected to the first electrode E31 so that the first electrode E31 may carry the same potential as the plasma container 2 or a positive but different potential.

Description is now be given on an example of the film depositing method of the invention employing the above film depositing apparatus. First, the vacuum exhaust unit 18 operates to produce a predetermined pressure in the plasma forming chamber C, and the material gas supply unit 12 supplies the deposition material gas into the plasma forming chamber C. Also, the RF power source 17 supplies an RF power to the cylindrical electrode 14 through the matching unit 16 so that the plasma is produced from the gas thus supplied, and more specifically is formed near the periphery of the target object 10, i.e., in the position indicated by 13 in the figure.

The target object 10 is exposed to the plasma for depositing the film on the object surface as described above, and the target surface is irradiated with ion beams. The irradiation with ion beams is performed as follows. The material gas of ions is supplied into the plasma container 2 of the ion source I from the ion source gas supply unit 1, and the RF power is supplied across RF electrodes 21 and 22 from a power source 4 via a matching unit 3 so that the plasma is produced in the position within the ion source indicated by 8 in the figure. The positive power source P1 places the positive potential on the electrodes 21 and 22. The second electrode E32 of the beam producing electrode system E3 is supplied with a negative voltage from a negative power source P5, and the third electrode E33 is supplied with a positive voltage from a positive power source P6. The positive voltage applied to the third electrode E33 is determined such that the voltage does not impede production of the positive ion beams. In particular, the positive voltage is determined such that the potential on the third electrode E33 is not extremely higher than the potential of the film deposition plasma 13. The positive ion beams are produced from the plasma 8 by the potential difference between the first and second electrodes E31 and E32. The fourth electrode E34 at the ground potential fixes the energy of the ion beams with respect to the ground potential. In this manner, the positive ion beams are produced from the plasma 8 through the ion beam producing port 23 of the plasma container 2, and is emitted to the target object through the opening in the cylindrical electrode 14. If the plasma forming chamber C and the ion source I use the same material gas, the gas supplied from the material gas supply unit 12 into the plasma forming chamber C or the gas supplied from the gas supply unit 1 into the plasma container 2 may be used commonly by the chamber C and the container 2. In this manner, the intended film is deposited on the target object 10.

In the structure wherein the cylindrical electrode 14 is arranged near the ion source I as shown in FIG. 1(A), the material gas plasma 13 may come into contact with the electrode system E3. In this case, the material gas plasma passes through the fourth electrode E34 at the ground potential arranged in the outermost position, but the third electrode carrying the positive potential suppresses the flow of the positive ions in the plasma into a space between the first and second electrodes E31 and E32. Further, the second electrode E32 carrying the negative potential suppresses flow of the electrons in the plasma, which passed through the third electrode, into the plasma container 2. The film deposition plasma 13 flows to the position between the fourth and third electrodes E34 and E33. However, the third electrode E33 carries the positive potential which is, at most, slightly higher than that of the film deposition plasma 13. Therefore, problems such as abnormal discharge and short-circuit do not occur between the fourth and third electrodes E34 and E33, and the normal operation can be performed.

Owing to the above, It is not necessary to arrange the ion source I such that the ion beam producing electrode system E3 is considerably remote from the cylindrical electrode 14, and it is also not necessary to employ such a structure that the diameter of the cylindrical electrode 14 is considerably larger than the diameters of the respective electrodes of the ion beam producing electrode system E3 for preventing direct contact of the film deposition plasma 13 with the beam producing electrode system E3. Therefore, increase in size of the apparatus and complication of the structure can be avoided.

Figure 1B:
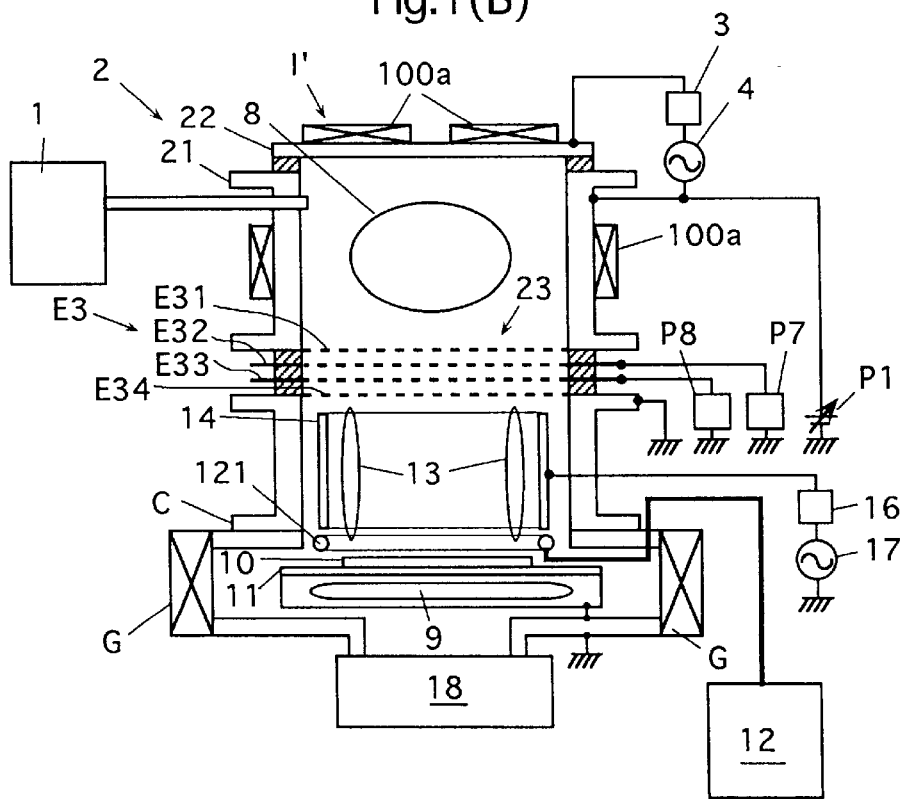

FIG. 1(B) shows a schematic structure of another embodiment of the film depositing apparatus provided with an ion source. This apparatus is provided with an ion source I' instead of the ion source I in the film depositing apparatus shown in FIG. 1(A). The ion source I' differs from the ion source I shown in FIG. 1(A) in that the second electrode E32 of the beam producing electrode system E3 is not connected to the negative power source P5, but is connected to a power source P7 which can apply a voltage placing a potential lower than that of the film deposition plasma 13 on the electrode E32, and that the third electrode E33 is not connected to the positive power source P6, but is connected to a power source P8 which can apply a voltage placing a potential higher than that of the film deposition plasma 13 on the electrode E33. Structures other than the above are similar to those of the device shown in FIG. 1(A), and the substantially same parts bear the same reference numbers.

In this apparatus, the film is likewise deposited on the target object 10 by simultaneously forming the plasma from the film deposition material gas and performing irradiation with the ion beams. For this, film deposition material gas plasma 13 is produced in the plasma production chamber C similarly to the device shown in FIG. 1(A). Further, the plasma 8 is produced from the ion material gas in the plasma container 2 of the ion source I' similarly to the operation of the ion source I shown in FIG. 1(A). The power source P7 applies the voltage to the second electrode E32 to place a potential lower than that of the film deposition plasma 13 on the second electrode E32, and the power source P8 applies a voltage to the third electrode E33 to place a potential higher than that of the film deposition plasma 13 on the third electrode E33. The voltage applied to the third electrode E33 is determined such that the potential on the electrode E33 is slightly higher than that of the film deposition plasma 13. Accordingly, the electrode E33 does not substantially impede the production of the positive ion beams from the plasma 8. Owing to the potential difference between the first and second electrodes E31 and E32, the positive ion beams are produced from the plasma 8. The fourth electrode E34 at the ground potential fixes the energy of the ion beams with respect to the ground potential. By forming the film deposition gas plasma 13 and irradiating the object with the positive ion beams by the ion source I' as described above, an intended film is formed on the target object 10.

In the apparatus shown in FIG. 1(B), if the beam producing electrode system E3 and the film deposition plasma 13 are in contact with each other, the film deposition plasma 13 passes through the fourth electrode E34 at the ground potential located in the outermost position. However, the third electrode E33 carrying a slightly higher potential than the film deposition plasma 13 suppresses flow of the positive ions in the plasma 13 into a space between the first and second electrodes E31 and E32. Further, the electrons in the film deposition plasma 13 pass through the third electrode E33, but the second electrode E32 at a lower potential than the plasma 13 suppresses flow of such electrons into the plasma container 2. The film deposition plasma 13 flows into a space between the fourth and third electrodes E34 and E33, but problems such as abnormal discharge and short-circuit do not occur, and the operation can be performed accurately because the third electrode E33 carries a potential which is, at most, slightly higher than the film deposition plasma 13.

Increase in size of the apparatus and complication of the structure can be avoided, as can also be done in the structure shown in FIG. 1(A).

Description will now be given on experimental examples of film deposition by the film depositing apparatuses shown in FIGS. 1(A) and 1(B). Also, description will be given on comparative examples 1 and 2. In the comparative example 1, the film deposition was performed with the film depositing apparatus which is similar to the apparatus shown in FIG. 1(A) but employs the ion source provided with the beam producing electrode system in FIG. 2 formed of the three electrodes instead of the ion source I in FIG. 1(A). In the comparative example 2, the film deposition was performed with the film depositing apparatus which is similar to the apparatus shown in FIG. 1(A) but employs the ion source provided with the beam producing electrode system in FIG. 3 formed of the four electrodes instead of the ion source I in FIG. 1(A). In each of the apparatuses used in the comparative examples 1 and 2, the ion beam producing electrode system of the ion source is located near the cylindrical RF electrode, as is done in the apparatuses shown in FIGS. 1(A) and 1(B).

EXPERIMENTAL EXAMPLE 1
(Using the Device in FIG. 1(A))

| | |
|---|---|
| Deposition Material Gas | SiH$_4$ 30% |
| | H$_2$ 70% |
| Film Deposition Plasma | produced by RF discharge (13.56 Hz) |
| | potential of 80 V |
| Deposition Pressure | 1 × 10$^{-3}$ Torr |
| Ion Source | |
| Ion Material Gas | same as deposition material gas |
| Potential in Plasma Container | +2000 V |
| Potential on 1st Electrode E31 | +2000 V |
| Potential on 2nd Electrode E32 | −100 V |
| Potential on 3rd Electrode E33 | +150 V |
| Potential on 4th Electrode E34 | ground potential |

Under the above conditions, formation of the plasma from the deposition material gas and irradiation with ion beams were continuously performed in parallel with each other for one hour. No abnormal operation such as abnormal discharge occurred in the beam producing electrode system in the ion source, and the film deposition could be performed correctly.

EXPERIMENTAL EXAMPLE 2
(Using the Device in FIG. 1(B))

| | |
|---|---|
| Deposition Material Gas | SiH$_4$ 30% |
| | H$_2$ 70% |
| Film Deposition Plasma | by RF discharge (13.56 Hz) |
| | potential of 80 V |
| Deposition Pressure | 1 × 10$^{-3}$ Torr |
| Ion Source | |
| Potential in Plasma Container | +2000 V |
| Potential on 1st Electrode E31 | +2000 V |
| Potential on 2nd Electrode E32 | +40 V |
| Potential on 3rd Electrode E33 | +150 V |
| Potential on 4th Electrode E34 | ground potential |

Under the above conditions, formation of the plasma from the deposition material gas and irradiation with ion beams were continuously performed in parallel with each other for one hour. No abnormal operation such as abnormal discharge occurred in the beam producing electrode system in the ion source, and the film deposition could be performed correctly.

Comparative Example 1
(Using the Conventional Device Which is Similar to that in FIG. 1(A) but is Provided with the ion Source in FIG. 2 Instead of the ion Source I)

| | |
|---|---|
| Deposition Material Gas | SiH$_4$ 30% |
| | H$_2$ 70% |
| Film Deposition Plasma | by RF discharge (13.56 Hz) |
| | potential of 80 V |
| Deposition Pressure | 1 × 10$^{-3}$ Torr |
| Ion Source | |
| Potential in Plasma Container | +2000 V |
| Potential on 1st Electrode E11 | +2000 V |
| Potential on 2nd Electrode E12 | −100 V |
| Potential on 3rd Electrode E13 | ground potential |

Under the above conditions, formation of the plasma from the deposition material gas and irradiation with ion beams were simultaneously started. Immediately after the start, abnormal discharge occurred in the beam producing electrode system in the ion source, and the film deposition could not be performed correctly.

Comparative Example 2
(Using the Device which is Similar to that in FIG. 1(A) but is Provided with the ion Source in FIG. 3 Instead of the ion Source I)

| | |
|---|---|
| Deposition Material Gas | SiH$_4$ 30% |
| | H$_2$ 70% |
| Film Deposition Plasma | by RF discharge (13.56 Hz) |
| | potential of 80 V |
| Deposition Pressure | 1 × 10$^{-3}$ Torr |
| Ion Source | |
| Potential in Plasma Container | +2000 V |
| Potential on 1st Electrode E21 | +2000 V |
| Potential on 2nd Electrode E22 | +1000 V |
| Potential on 3rd Electrode E23 | −500 V |
| Potential on 4th Electrode E24 | ground potential |

Under the above conditions, formation of the plasma from the deposition material gas and irradiation with ion beams were simultaneously started. Immediately after the start, abnormal discharge occurred in the beam producing electrode system in the ion source, and the film deposition could not be performed correctly.

From the above results, the following can be understood. According to the apparatus and method for film deposition of the invention, a positive potential or a potential higher than that of the film deposition plasma is placed on the third electrode of the ion source, and a negative potential or a potential lower than that of the film deposition plasma is placed on the second electrode, whereby problems such as abnormal discharge in the beam producing electrode system do not occur, and the ion source can operate correctly for film deposition.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of depositing a film on an upper surface of a target object in a plasma forming chamber of a film depositing apparatus comprises the steps of:

producing a predetermined pressure in the plasma forming chamber;

supplying a deposition material gas into the plasma forming chamber;

supplying electric power to a plasma deposition electrode positioned above the target object in the plasma forming chamber to expose the upper surface of the target object to a first plasma produced from the deposition material gas supplied to the plasma forming chamber; and simultaneously irradiating the upper surface of the target object with ion beams produced by an ion source while supplying the electric power to the plasma deposition electrode, wherein the ion source produces the ion beams from a second plasma produced from an ion material gas in a second plasma container by applying a voltage to an ion beam producing electrode system formed of four electrodes arranged in an ion beam producing port of the second plasma container, and potentials are placed on the second plasma container and the four electrodes that form the ion beam producing electrode system while producing the ion beams such that each of the second plasma container and a first electrode of the four electrodes located in an inner position nearest to the second plasma container carries a positive potential, a second electrode located immediately outside the first electrode relative to the second plasma container carries a negative potential, a third electrode located immediately outside the second electrode relative to the second plasma container carries a positive potential and a fourth electrode located remotest from the second plasma container carries a ground potential, wherein abnormal discharge in the ion beam producing electrode system does not occur and the ion source operates to deposit the film on the upper surface of the target object.

2. A method of depositing a film on an upper surface of a target object in a plasma forming chamber of a film depositing apparatus comprises the steps of:

producing a predetermined pressure in the plasma forming chamber;

supplying a deposition material gas into the plasma forming chamber;

supplying electric power to a plasma deposition electrode positioned above the target object in the plasma forming chamber to expose the upper surface of the target object to a first plasma produced from the deposition material gas supplied to the plasma forming chamber; and simultaneously irradiating the upper surface of the target object with ion beams produced by an ion source while supplying the electric power to the plasma deposition electrode, wherein the ion source produces the ion beams from a second plasma produced from an ion material gas in a second plasma container by applying a voltage to an ion beam producing electrode system formed of four electrodes arranged in an ion beam producing port of the second plasma container, and potentials are placed on the second plasma container and the four electrodes that form the ion beam producing electrode system while producing the ion beams such that each of the second plasma container and a first electrode of the four electrodes is located in an inner position nearest to the second plasma container carries a positive potential, a second electrode located immediately outside the first electrode relative to the second plasma container carries a lower potential than the first plasma, a third electrode located immediately outside the second electrode relative to the second plasma container carries a higher potential than the first plasma and a fourth electrode located remotest from the second plasma container carries a ground potential, wherein abnormal discharge in the ion beam producing electrode system does not occur and the ion source operates to deposit the film on the upper surface of the target object.

3. The method according to claim 1, wherein the deposition material gas and the ion material gas are the same.

* * * * *